(12) United States Patent
Bayer et al.

(10) Patent No.: US 7,851,978 B2
(45) Date of Patent: Dec. 14, 2010

(54) PIEZO ACTUATOR COMPRISING A MULTILAYER ENCAPSULATION, AND METHOD FOR THE PRODUCTION THEREOF

(75) Inventors: Heiner Bayer, Olching (DE); Hellmut Freudenberg, Grossberg (DE); Axel Ganster, Schwindegg (DE); Christoph Hamann, Thalmassing (DE); Oliver Hennig, München (DE); Jens Dahl Jensen, Berlin (DE); Günter Lugert, München (DE); Randolf Mock, Hohenbrunn (DE); Carsten Schuh, Baldham (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/298,096

(22) PCT Filed: Apr. 24, 2007

(86) PCT No.: PCT/EP2007/053978
§ 371 (c)(1),
(2), (4) Date: Jul. 6, 2009

(87) PCT Pub. No.: WO2007/122227
PCT Pub. Date: Nov. 1, 2007

(65) Prior Publication Data
US 2009/0302713 A1  Dec. 10, 2009

(30) Foreign Application Priority Data
Apr. 26, 2006  (DE) .................. 10 2006 019 489

(51) Int. Cl.
*H01L 41/083* (2006.01)
(52) U.S. Cl. .................................... 310/340; 310/366
(58) Field of Classification Search ................ 310/340, 310/366
See application file for complete search history.

(56) References Cited

U.S. PATENT DOCUMENTS

2009/0294556 A1* 12/2009 Bosch et al. ................ 239/584
2010/0180865 A1*  7/2010 Vendulet et al. ............ 123/472

FOREIGN PATENT DOCUMENTS

| DE | 197 53 930 A1 | 6/1999 |
| EP | 0 603 588 A | 11/1993 |
| JP | 01 137686 A | 5/1989 |
| WO | WO 01/48834 A | 7/2001 |
| WO | WO 2005/087979 A2 | 9/2005 |
| WO | WO 2007/093921 A | 8/2007 |
| WO | WO 2007/102088 A | 9/2007 |

OTHER PUBLICATIONS

International Search Report PCT/EP2007/053978, 2 pages, Nov. 6, 2007.

* cited by examiner

*Primary Examiner*—Thomas M Dougherty
(74) *Attorney, Agent, or Firm*—King & Spalding L.L.P.

(57) ABSTRACT

In a method for producing a multilayer encapsulation (1) of a piezo actuator (5) such that the piezo actuator (5) is protected towards the outside without having to use an additional enveloping housing-type structure, in order to produce the multilayer encapsulation (1), an electrically insulating elastic layer (10) is first applied to the surface of the piezo actuator (5), whereupon a metallic layer is applied to the electrically insulating elastic layer (10) so as to planarly cover the same.

9 Claims, 1 Drawing Sheet

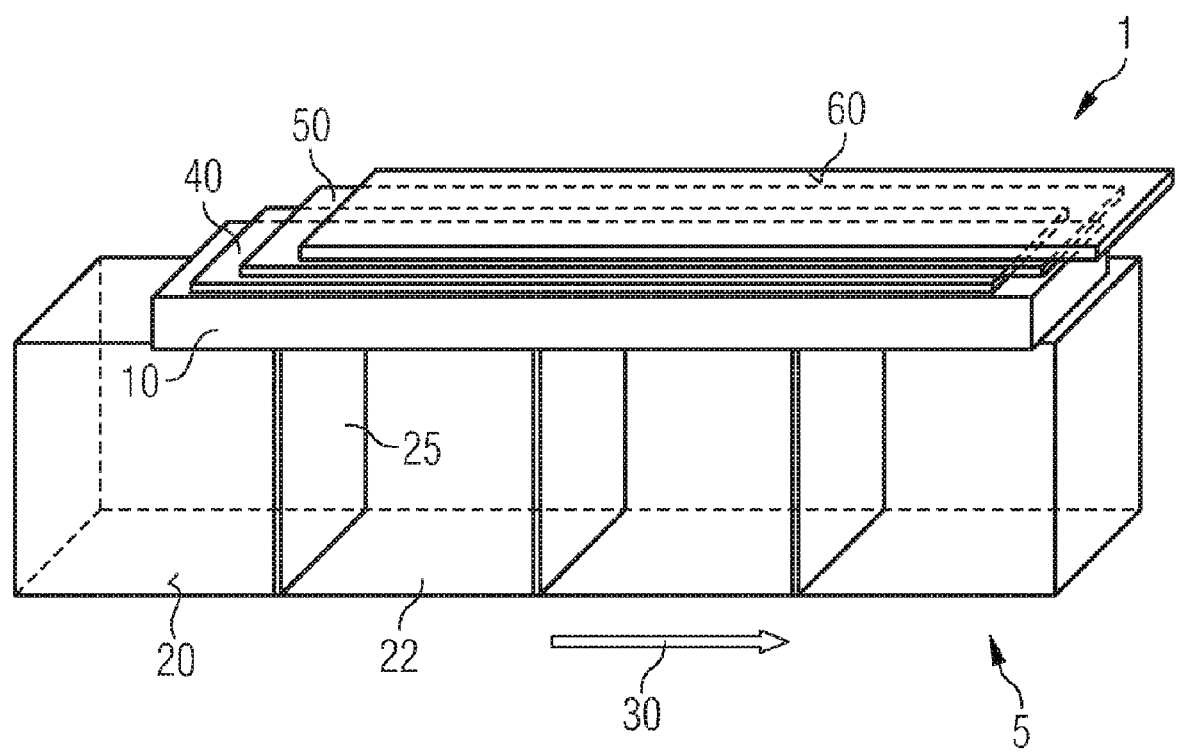

PIEZO ACTUATOR COMPRISING A MULTILAYER ENCAPSULATION, AND METHOD FOR THE PRODUCTION THEREOF

CROSS-REFERENCE TO RELATED APPLICATIONS

This application is a U.S. National Stage Application of International Application No. PCT/EP2007/053978 filed Apr. 24, 2007, which designates the United States of America, and claims priority to German Application No. 10 2006 019 489.6 filed Apr. 26, 2006, the contents of which are hereby incorporated by reference in their entirety.

TECHNICAL FIELD

The present invention relates to a production method for multilayer encapsulation of a piezo actuator and to a piezo actuator with multilayer encapsulation.

BACKGROUND

In recent years, the demand for piezoceramic actuators (piezo actuators) has grown significantly due to their increasing use, e.g. in the latest diesel injection systems in the automobile industry. This demand likewise promotes the development of piezo actuators. In many new injection configurations, the piezo actuators are completely surrounded by diesel fuel. This type of configuration of the injection systems is also known as "wet design".

Since the piezo actuators are chemically and electrically attacked when in direct contact with diesel fuel, which is impure or has been modified by additives, an appropriate protective envelope must be provided for the piezo actuator. This protective envelope should provide both electrical insulation against possible short circuit through the electrically conductive fuel and chemical insulation against the attack of the surrounding fuel on the components of the piezo actuator.

The prior art discloses metal casings of different configurations which surround the piezo actuator. One example of such a metal casing is a corrugated pipe. The metal casings are filled with suitable filler materials in order to effect a transfer of the pressure, which is applied by the fuel, onto the internally situated piezo actuator. However, this design solution has the disadvantages that it is expensive to produce and is space-intensive.

SUMMARY

A protection for a piezo actuator can be provided, which protection ensures reliable electrical and chemical insulation of the piezo actuator against external influences.

According to an embodiment, a production method for a multilayer encapsulation of a piezo actuator, such that the piezo actuator is externally protected without an additional solid casing-like enveloping structure, may comprise the following steps: a) depositing an electrically insulating elastic layer onto a surface of the piezo actuator, said surface running parallel with the longitudinal or stacking direction of the piezo actuator, b) depositing a metallic layer onto the elastic layer, such that the metallic layer covers the electrically insulating elastic layer in a planar manner, c) depositing a further electrically insulating elastic layer onto the metallic layer, and d) depositing a further metallic layer onto the further electrically insulating elastic layer, wherein the electrically insulating layer, the further electrically insulating elastic layer and the further metallic layer are adapted in terms of material and thickness, such that a gradual property transition from the piezo actuator to the further metallic layer is created, thereby ensuring compatible material behavior of encapsulation and piezo actuator.

According to a further embodiment, the electrically insulating elastic layer can be a plastic layer, preferably a polymer layer. According to a further embodiment, the electrically insulating elastic layer may consist of silicone elastomer, polyurethane, polyimide or epoxide. According to a further embodiment, the production method may comprise the further step of depositing the electrically insulating elastic layer by means of suitable coating methods, preferably by means of dipping, spraying, injecting, screen printing or lamination of films. According to a further embodiment, the production method may comprise the further step of generating the metallic layer as a diffusion-proof metal layer. According to a further embodiment, the production method may comprise the further step of creating the metallic layer by means of suitable coating methods for deposition of metals onto surfaces which are not electrically conductive. According to a further embodiment, the metallic layer can be created by means of chemical direct metallization. According to a further embodiment, the metallic layer can be created by means of a physical vapor deposition method. According to a further embodiment, the production method may comprise the further step of reinforcing the metallic layer by means of an electroplating coating method.

According to another embodiment, a piezo actuator with multilayer encapsulation, in particular a multilayer actuator, such that the piezo actuator is externally protected without an additional solid casing-type enveloping structure, may comprise—a piezo actuator,—an electrically insulating elastic layer on a surface of the piezo actuator, said surface running parallel with the longitudinal or stacking direction of the piezo actuator,—a metallic layer on the electrically insulating elastic layer, said metallic layer covering the electrically insulating elastic layer in a planar manner,—a further electrically insulating elastic layer on the metallic layer, and—a further metallic layer on the further electrically insulating elastic layer, wherein the electrically insulating layer, the further electrically insulating elastic layer and the further metallic layer are adapted in terms of material and thickness, such that a gradual property transition from the piezo actuator to the further metallic layer is created, thereby ensuring compatible material behavior of encapsulation and piezo actuator.

BRIEF DESCRIPTION OF THE DRAWINGS

The embodiments are explained in greater detail with reference to the accompanying drawing. This shows a schematic sectional illustration of a piezo actuator in profile, said piezo actuator having an embodiment of a multilayer encapsulation on one of its side surfaces.

DETAILED DESCRIPTION

The above production method for multilayer encapsulation of a piezo actuator, such that the piezo actuator is externally protected without an additional casing-like enveloping structure, comprises the following steps: a) depositing an elastic layer onto a surface of the piezo actuator, said surface running parallel with the longitudinal or stacking direction of the piezo actuator, and b) depositing a metallic layer onto the elastic layer, such that the metallic layer covers the elastic layer in a planar manner.

An expensive permanent casing-type enveloping structure of the piezo actuator is replaced in that the piezo actuator is coated by a multilayer structure, at least on its side surfaces. This multilayer structure consists of at least one elastic layer having elastic material properties and a metallic layer which is deposited onto this elastic layer. The above multilayer structure or multilayer encapsulation encloses the piezo actuator completely or is limited to its side surfaces parallel with its stacking direction. The combination of elastic and metallic layers ensures that the piezo actuator is sufficiently impermeable relative to the medium, e.g. in a pressurized fuel tank. The chemically aggressive fuel is therefore unable to attack the piezo actuator. Furthermore, the multilayer encapsulation ensures that, despite the surrounding fuel pressure, the piezo actuator is sufficiently mobile in the multilayer encapsulation that it can effect control operations, e.g. relative to fuel valves.

According to an embodiment, the elastic layer preferably consists of silicone elastomer, polyurethane, polyimide or epoxide. According to a further alternative of the present production method, this elastic layer is deposited by means of suitable coating methods such as dipping, spraying, injecting, screen printing or lamination of films.

According to a further embodiment, the metallic layer is created as a diffusion-proof metal layer on the elastic layer. In terms of material and dimensions, the metallic layer is adapted to the surrounding medium, such that it provides a chemical insulation against this medium.

In order to create the metallic layer, suitable coating methods are utilized for deposition of metals onto surfaces which are not electrically conductive. One alternative is e.g. the corona discharge activation using active oxygen. A further alternative is the creation of the metallic layer using a physical vapor deposition method (PVD). According to a further alternative, it is also conceivable initially to create a metallic layer which is too thin for chemical protection, and to reinforce this by means of an electroplating coating method in a subsequent step.

According to a further embodiment of the above production method, the already existing combination of elastic and metallic layer is reinforced by the deposition of a further elastic layer onto the metallic layer and a further metallic layer onto the elastic layer. In addition to the reinforcement, it is possible to configure the mechanical properties of the multilayer encapsulation of the piezo actuator in this way, in order to ensure optimal operation of the piezo actuator in the relevant surrounding medium. In terms of material and thickness, the further elastic layer and the further metallic layer are therefore adapted such that a gradual property transition from the piezo actuator to the outermost metallic layer can be created, thereby ensuring compatible material behavior of encapsulation and piezo actuator. According to a further alternative, provision is made for all of the multilayer encapsulation layers deposited on the piezo actuator to be coordinated in respect of material properties and dimension, in order to optimize the multilayer encapsulation in respect of its protective properties and the support of the operation of the piezo actuator. It is also conceivable to deposit more than the four layers cited above.

According to another embodiment, a piezo actuator with multilayer encapsulation, such that the piezo actuator is externally protected without an additional casing-type enveloping structure may have an elastic layer on a surface of the piezo actuator, which surface runs parallel with the longitudinal or stacking direction of the piezo actuator, and a metallic layer on the elastic layer, which metallic layer covers the whole of the elastic layer in a planar manner.

In order to meet the exacting requirements placed on a protective envelope of a piezo actuator 5 which is exposed to high-pressure fuel or as a result of the stress from another surrounding medium, the piezo actuator 5 is equipped with a multilayer encapsulation 1. This multilayer encapsulation 1 can be deposited by means of the production method described below, such that a piezo actuator 5 with multilayer encapsulation 1 is created.

The above requirements in relation to the multilayer encapsulation 1 include an impermeability relative to the medium and a chemical and electrical external insulation of the piezo actuator 5. This ensures that any attack from the surrounding medium does not damage or destroy the piezo actuator 5 or reduce its service life. As a further requirement, the multilayer encapsulation 1 provides a high elasticity at the contact surface between piezo actuator 5 and multilayer encapsulation 1. As a result of the high elasticity at this contact surface, the multilayer encapsulation 1 does not restrict the operation of the piezo actuator 5, and therefore almost the full path of travel of the piezo actuator 5 is available for any desired control operations.

In order to meet the above requirements, the multilayer encapsulation 1 is deposited onto the piezo actuator 5 in the form of a multilayer structure. According to a first alternative, the multilayer encapsulation is deposited onto the entire outer surface of the piezo actuator 5. According to a further alternative, the multilayer encapsulation 1 only covers the side surfaces of the piezo actuator 5, said side surfaces running parallel with the stacking direction 30. In the latter case, the end faces of the piezo actuator 5 which are perpendicular to the stacking direction 30 are adequately protected by their own material constitution or by other structures/configurations.

The multilayer encapsulation 1 firstly features an electrically insulating elastic layer 10. This layer 10 is deposited directly onto the surface of the piezo actuator 5 and consists of plastic, for example. This electrically insulating elastic layer 10 has the task of reducing the mechanical expansion of the piezo actuator 5 outwards. Specifically, this is intended to prevent the mechanical expansions of the piezo actuator 5, in particular also in the region of possible polarity fractures, from being transferred to the metallic layer 40, which is described below, in such a way that the latter is damaged. The electrically insulating elastic layer 10 therefore ensures that the metallic layer 40 remains undamaged even in dynamic continuous operation of the piezo actuator 5.

A further task of the electrically insulating elastic layer 10 is to insulate the surface of the piezo actuator 5. This insulation is effective against all external media, such that neither the material of the elastic layer 10 nor any other medium can penetrate into pores, surface fractures, polarity fractures or possible delaminations between internal electrodes 25 and piezoelectric layer 20.

According to different embodiments, the electrically insulating elastic layer 10 consists of silicone elastomer, polyurethane, polyimide or epoxide.

The elastic layer 10 is deposited onto the piezo actuator 5 using suitable coating methods, by means of which electrically insulating elastic layers 10 of sufficient thickness can be created on surfaces. Various alternatives of such a coating method are dipping, spraying, injecting, screen printing or lamination of films.

The multilayer encapsulation 1 additionally features a metallic layer 40 which has been deposited onto the elastic layer 10. The metallic layer is preferably generated as a diffusion-proof metal layer. Possible materials are routinely used metals which can be processed in the context of coating methods. These include copper or nickel, for example.

The function of the metallic layer 40 is to provide an external chemical insulation of the piezo actuator 5 with multilayer encapsulation 1. Above all, this chemical insulation prevents the chemical attack by a surrounding aggressive medium such as diesel fuel, for example.

The metallic layer 40 can be deposited using any suitable method which allows metallic layers to be created on surfaces which are not electrically conductive. According to a first alternative, the metal layer 40 is created by a chemical direct metallization as described in WO 2005/087979. In this case, a metal layer is created on silicone elastomers by means of a highly active corona discharge activation using active oxygen ions.

According to a further alternative, only a metallic thin film is initially deposited on the elastic layer 10 using a physical vapor deposition method (PVD). This metallic thin film is then reinforced by means of known electroplating coating methods, such that it provides an adequate chemical insulation. In the case of the above cited PVD method, the material to be deposited as a metallic layer 40 is present in solid form in a coating chamber. The subsequent layer material is deposited by means of evaporation, ionic bombardment, electron bombardment, current bombardment or laser bombardment onto the parts to be coated, and forms the desired metallic layer 40 there. In the case of the above cited electroplating coating methods, metallic ions from an electrolytic solution are deposited as a metallic layer or reinforcement onto the already existing metallic thin film.

In order to realize maximal impermeability relative to media, chemical and electrical insulation and expandability of the multilayer encapsulation 1, and thus to ensure optimal operation of the piezo actuator 5, provision is alternatively made for depositing in each case a further elastic layer 50 and a further metallic layer 60 onto the already existing layers 10, 40. Moreover, provision is preferably made for depositing a plurality of alternately arranged further elastic and metallic layers 50, 60 onto the already existing multilayer encapsulation 1. The multilayer encapsulation 1 consisting of elastic layer 10 and metallic layer 40 or consisting of a plurality of elastic layers 10, 50 and a plurality of metallic layers 40, 60 ensures a gradual property transition from the piezo actuator 5 to the outermost metallic layer 60 of the multilayer encapsulation 1. In this way, the outermost metallic layer of the multilayer encapsulation 1 is not damaged or destroyed by the expansion behavior of the piezo actuator 5. However, it also ensures that the piezo actuator 5 is not exposed to external stresses, e.g. excessively high temperatures.

For continuous operation of a piezo actuator 5 with multilayer encapsulation 1, it is additionally necessary for the materials that are used to have sufficient temperature stability and long-time stability. An exemplary temperature range for the piezo actuator 5 with multilayer encapsulation 1 lies between −40° C. and 180° C. Furthermore, the materials that are used must be so durable that they survive for the service life of the piezo actuator 5. An example of this service life would be approximately 10 years. It must also be noted that some metals, e.g. copper, are attacked by fuels or other media. Consequently, these should only be used as a metallic intermediate layer 40.

In comparison with previously used encapsulation methods for piezo actuators 5, the above described configuration offers a more compact construction, minimal attenuation of the piezo actuator 5 during its operation and a simpler design, without requiring a pressure transfer medium between piezo actuator 5 and the outer metallic layer of the multilayer encapsulation 1. It is further advantageous that the multilayer encapsulation 1 can be realized as a complete solution within a coating method, such that effort and costs involved in this production method are reduced in comparison with the prior art.

What is claimed is:

1. A piezo actuator with multilayer encapsulation, or a multilayer actuator, such that the piezo actuator is externally protected without an additional solid casing-type enveloping structure, comprising:
    a piezo actuator,
    an electrically insulating elastic layer on a surface of the piezo actuator, said surface running parallel with the longitudinal or stacking direction of the piezo actuator,
    a metallic layer on the electrically insulating elastic layer, said metallic layer covering the electrically insulating elastic layer in a planar manner,
    a further electrically insulating elastic layer on the metallic layer, and
    a further metallic layer on the further electrically insulating elastic layer, wherein the electrically insulating layer, the further electrically insulating elastic layer and the further metallic layer are adapted in terms of material and thickness, such that a gradual property transition from the piezo actuator to the further metallic layer is created, thereby ensuring compatible material behavior of encapsulation and piezo actuator.

2. The piezo actor according to claim 1, wherein the electrically insulating elastic layer is a plastic layer or a polymer layer.

3. The piezo actor according to claim 1, wherein the electrically insulating elastic layer consists of silicone elastomer, polyurethane, polyimide or epoxide.

4. The piezo actor according to claim 1, wherein the electrically insulating elastic layer is deposited by means of dipping, spraying, injecting, screen printing or lamination of films.

5. The piezo actor according to claim 1, wherein the metallic layer is generated as a diffusion-proof metal layer.

6. The piezo actor according to claim 1, wherein the metallic layer is created by means of suitable coating methods for deposition of metals onto surfaces which are not electrically conductive.

7. The piezo actor according to claim 1, wherein the metallic layer is created by means of chemical direct metallization.

8. The piezo actor according to claim 1, wherein the metallic layer is created by means of a physical vapor deposition method.

9. The piezo actor according to claim 8, wherein the metallic layer is reinforced by means of an electroplating coating method.

* * * * *